United States Patent
Chen et al.

(10) Patent No.: US 9,125,476 B2
(45) Date of Patent: Sep. 8, 2015

(54) CLIP ASSEMBLY AND ELECTRONIC DEVICE INCLUDING THE SAME

(71) Applicants:LITE-ON ELECTRONICS (GUANGZHOU) LIMITED, Guangzhou (CN); LITE-ON TECHNOLOGY CORP., Taipei (TW)

(72) Inventors: Kuan-Yu Chen, Taipei (TW); Che-Cheng Chang, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 172 days.

(21) Appl. No.: 14/039,080

(22) Filed: Sep. 27, 2013

(65) Prior Publication Data

US 2014/0092567 A1  Apr. 3, 2014

(30) Foreign Application Priority Data

Sep. 28, 2012  (CN) ...................... 2012 2 0504442 U

(51) Int. Cl.
| | |
|---|---|
| *A45F 5/00* | (2006.01) |
| *A45F 5/02* | (2006.01) |
| *B60R 11/02* | (2006.01) |
| *H05K 7/14* | (2006.01) |
| *B60R 11/00* | (2006.01) |

(52) U.S. Cl.
CPC ................. *A45F 5/021* (2013.01); *B60R 11/02* (2013.01); *H05K 7/1401* (2013.01); *A45F 5/02* (2013.01); *B60R 2011/0035* (2013.01); *B60R 2011/0059* (2013.01); *B60R 2011/0073* (2013.01); *B60R 2011/0078* (2013.01)

(58) Field of Classification Search
CPC ............... B60R 2011/0078; B60R 2011/0059; B60R 2011/0073; B60R 2011/0035; B60R 11/0241; A45F 5/02; A45F 5/021; A45F 2200/0516; A45F 2005/025; A45F 2200/0525; Y10T 24/1388
USPC ............. 361/679.01, 679.02, 679.55–679.59, 361/679.08, 679.09, 679.26–679.3, 679.45; 345/169, 184; 455/575.1, 575.3–575.4, 455/575.8, 556.1, 550.1, 90.1; 224/666–675, 195, 197, 163, 904
See application file for complete search history.

(56) References Cited

U.S. PATENT DOCUMENTS

| | | | | |
|---|---|---|---|---|
| 6,311,881 | B1 * | 11/2001 | Kamiya ........................ | 224/195 |
| 6,315,182 | B1 * | 11/2001 | Chen ............................ | 224/420 |
| 6,315,255 | B1 * | 11/2001 | Chan et al. ............... | 248/221.11 |
| 6,481,684 | B1 * | 11/2002 | Farmer et al. .............. | 248/309.3 |
| 6,626,336 | B1 * | 9/2003 | Krusell ......................... | 224/271 |
| 6,955,279 | B1 * | 10/2005 | Mudd et al. ................... | 224/197 |
| 6,978,517 | B2 * | 12/2005 | Collins et al. .................. | 24/3.12 |
| 7,657,280 | B2 * | 2/2010 | Guo et al. ................. | 455/550.1 |
| 8,139,781 | B2 * | 3/2012 | Cheng et al. .................... | 381/74 |

(Continued)

*Primary Examiner* — Adrian S Wilson
*Assistant Examiner* — Abhishek Rathod
(74) *Attorney, Agent, or Firm* — Rosenberg, Klein & Lee

(57) ABSTRACT

A clip assembly includes a seat having a surrounding wall with a receiving hole, and a locking mechanism proximate to the surrounding wall and including a pair of movable levers. Each movable lever has an engaging portion movably inserted into the receiving hole, and a driven portion. A drive unit has a button that is moved to a pressed position, where the driven portions are pushed to move away from each other and out of the receiving hole. A clip mechanism includes a connection body received in the receiving hole and having two connecting holes to respectively engage the engaging portions. The engaging portions are disengageable from the connecting holes by pressing the button.

18 Claims, 8 Drawing Sheets

(56) References Cited

U.S. PATENT DOCUMENTS

| | | | |
|---|---|---|---|
| 8,333,310 B2* | 12/2012 | Tages | 224/197 |
| 8,631,980 B2* | 1/2014 | Youssefi-Shams et al. | 224/197 |
| 2001/0054217 A1* | 12/2001 | Wang | 24/3.1 |
| 2003/0162510 A1* | 8/2003 | Kim | 455/90 |
| 2004/0035897 A1* | 2/2004 | Salentine et al. | 224/162 |
| 2005/0236545 A1* | 10/2005 | Seil et al. | 248/311.2 |
| 2008/0110946 A1* | 5/2008 | Dixon et al. | 224/197 |
| 2009/0101684 A1* | 4/2009 | Martinez | 224/197 |
| 2009/0120979 A1* | 5/2009 | Martinez | 224/199 |
| 2011/0069481 A1* | 3/2011 | Chen | 362/191 |
| 2011/0155774 A1* | 6/2011 | Gandhi et al. | 224/197 |
| 2012/0212113 A1* | 8/2012 | Liu et al. | 312/223.2 |
| 2012/0212884 A1* | 8/2012 | Su | 361/679.01 |
| 2013/0062489 A1* | 3/2013 | DiNello et al. | 248/224.8 |
| 2013/0105527 A1* | 5/2013 | Rekuc et al. | 224/183 |
| 2013/0146632 A1* | 6/2013 | Lai | 224/572 |
| 2014/0014694 A1* | 1/2014 | Li | 224/199 |

* cited by examiner

CLIP ASSEMBLY AND ELECTRONIC DEVICE INCLUDING THE SAME

CROSS-REFERENCE TO RELATED APPLICATION

This application claims priority of Chinese Patent Application No. 201220504442.6, filed on Sep. 28, 2012.

BACKGROUND OF THE INVENTION

1. Field of the Invention

This invention relates to a clip assembly, more particularly to a clip assembly, and to an electronic device including the clip assembly.

2. Description of the Related Art

A vehicle is generally provided with two sun visors that are foldably disposed on top of a windshield and that are spaced apart in a left-right direction for blocking the dazzling sunlight when desired. When not in use, the sun visors can be folded to the vehicle roof. Since the sun visor is in the form of a plate and may support an object within a certain weight range, an electronic device, such as a Bluetooth hands-free headset, may be provided with a back clip to couple to the sun visor for easy operation by the user.

A conventional back clip is made of a folded metal strip or plate and is engaged to a corresponding locking groove formed in an outer casing of the electronic device. However, since some electronic devices may need to leave the vehicle with the user, the back clip may cause inconvenience during transportation if not removed, while removal or re-assembly of the back clip is rather difficult to perform. In addition, repeated reassembling and removing operations may cause deformation of the back clip, which may damage the structure of the locking groove in the outer casing of the electronic device.

SUMMARY OF THE INVENTION

Therefore, an object of the present invention is to provide a clip assembly and an electronic device including the same, where the clip assembly can be easily engaged to or disengaged from a housing of the electronic device.

According to one of an aspect of this invention, a clip assembly comprises a base, a locking mechanism and a clip mechanism.

The base has an inner surface, an outer surface, and a surrounding wall that extends from the outer surface to the inner surface and that defines a receiving hole. The receiving hole extends through the outer surface and is closed by the inner surface. The surrounding wall has two opposite through holes that communicate with the receiving hole and that are disposed at two opposite sides of the receiving hole.

The locking mechanism is disposed in proximity to the inner surface and the surrounding wall. The locking mechanism includes a pair of movable levers, a drive unit and a restoring unit. Each of the movable levers has an engaging portion that is movably inserted into the receiving hole through a corresponding one of the through holes of the surrounding wall, a pivot portion, an intermediate portion that interconnects the engaging portion and the pivot portion, and a driven portion that extends from one side of the pivot portion away from the intermediate portion. The movable levers are connected pivotally to each other in a scissor fashion at the pivot portions of the movable levers. The driven portion of one of the movable levers is opposite to and spaced-apart from the driven portion of another one of the movable levers. The drive unit has a button that is disposed between the driven portions of the movable levers. The button is movable between an un-pressed position and a pressed position. The driven portions are pushed to move the engaging portions away from each other and out of the receiving hole via the through holes through a movement of the button from the un-pressed position to the pressed position. The restoring unit is connected to the intermediate portions of the movable levers so that the movable levers are restored to original positions thereof when the button is un-pressed.

The clip mechanism includes an elastic clip and a connection member. The elastic clip has first and second arms that are movable toward or away from each other. The connection member is disposed on the first arm and has a connection body that extends outwardly from the first arm in a direction away from the second arm. The connection body is receivable in the receiving hole and has two connecting holes that respectively engage the engaging portions when the connection body is received in the receiving hole. The engaging portions are disengageable from the connecting holes by pressing the button.

According to another aspect of this invention, an electronic device comprises a housing, a circuit module that is mounted in the housing, and a clip assembly that includes a base, a locking mechanism and a clip mechanism.

The base is formed integrally with the housing and has an inner surface, an outer surface, and a surrounding wall that extends from the outer surface to the inner surface and that defines a receiving hole. The receiving hole extends through the outer surface and is closed by the inner surface. The surrounding wall has two opposite through holes that communicate with the receiving hole and that are disposed at two opposite sides of the receiving hole.

The locking mechanism is disposed in proximity to the inner surface and the surrounding wall. The locking mechanism includes a pair of movable levers, a drive unit and a restoring unit. Each of the movable levers has an engaging portion that is movably inserted into the receiving hole through a corresponding one of the through holes of the surrounding wall, a pivot portion, an intermediate portion that interconnects the engaging portion and the pivot portion, and a driven portion that extends from one side of the pivot portion away from the intermediate portion. The movable levers are connected pivotally to each other in a scissor fashion at the pivot portions of the movable levers. The driven portion of one of the movable levers is opposite to and spaced-apart from the driven portion of another one of the movable levers. The drive unit has a button that is disposed between the driven portions of the movable levers. The button is movable between an un-pressed position and a pressed position. The driven portions are pushed to move the engaging portions away from each other and out of the receiving hole via the through holes through a movement of the button from the un-pressed position to the pressed position. The restoring unit is connected to the intermediate portions of the movable levers so that the movable levers are restored to original positions thereof when the button is un-pressed.

The clip mechanism includes an elastic clip and a connection member. The elastic clip has first and second arms that are movable toward or away from each other. The connection member is disposed on the first arm and has a connection body that extends outwardly from the first arm in a direction away from the second arm. The connection body is receivable in the receiving hole and has two connecting holes that respectively engage the engaging portions when the connection body is received in the receiving hole. The engaging portions are disengageable from the connecting holes by pressing the button.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENT

Figure 1:
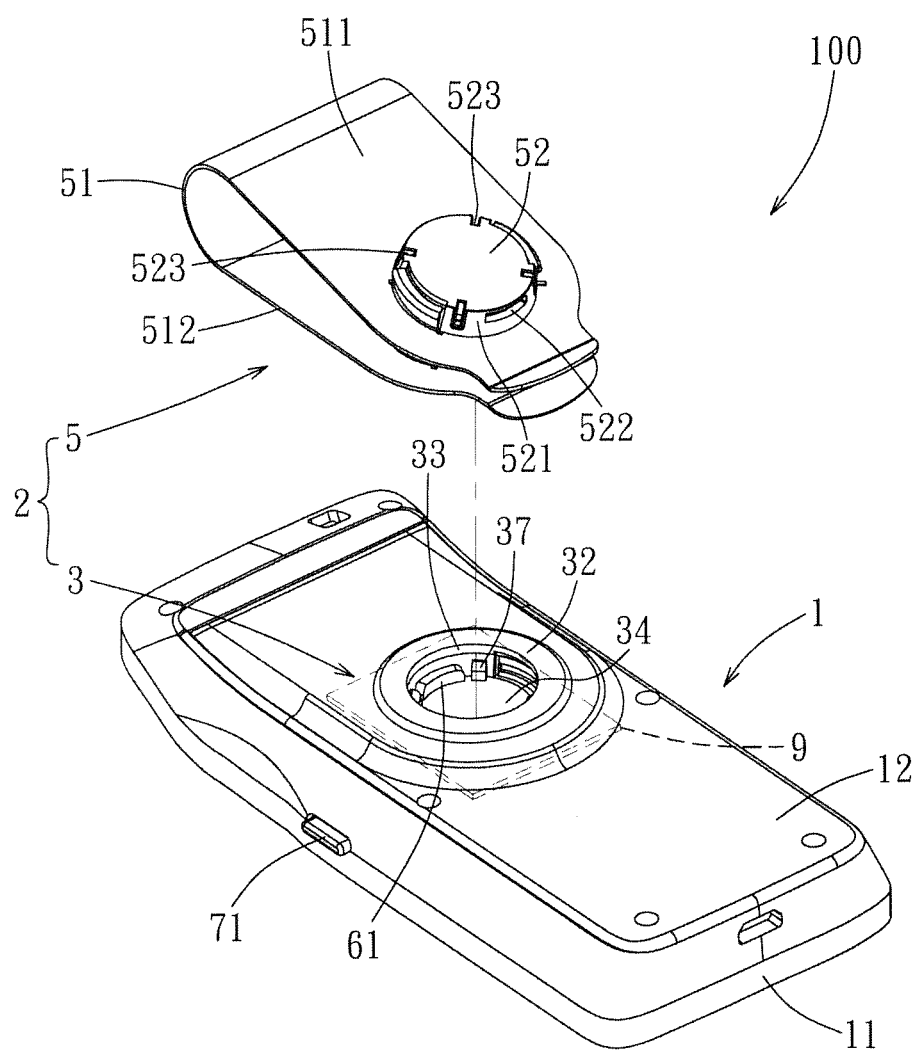
FIG. 1 is an exploded perspective view of the preferred embodiment of an electronic device according to the present invention, illustrating a structural relationship between a locking mechanism and a clip mechanism of a clip assembly of the electronic device.
Figure 2:
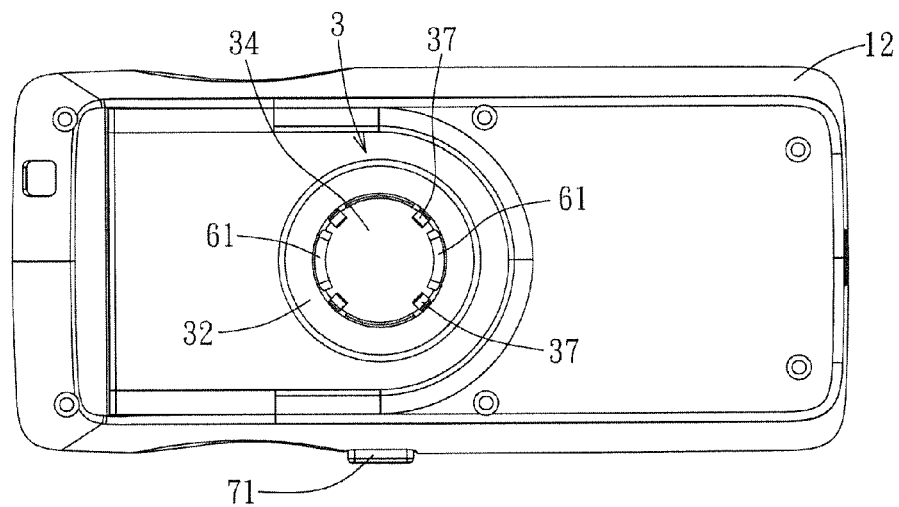
FIG. 2 is a top view illustrating the locking mechanism of the clip assembly of the preferred embodiment.

Referring to FIGS. 1 to 4, the preferred embodiment of an electronic device 100 according to the present invention is illustrated. The electronic device 100 includes a housing 1, a circuit module 9 that is disposed in the housing 1, and a clip assembly 2 adapted to be assembled with the housing 1. In this embodiment, the electronic device 100 is driven by electricity, and is, for example, a Bluetooth hands-free headset.

The clip assembly 2 includes a base 3, a locking mechanism 4 and a clip mechanism 5. The base 3 is formed integrally with the housing 1. In this embodiment, the housing 1 is composed of a first casing 11 and a second casing 12. The base 3 is substantially a part of the second casing 12. The base 3 has an inner surface 31, an outer surface 32, and a surrounding wall 33 that extends from the outer surface 32 to the inner surface 31 and that defines a receiving hole 34. The receiving hole 34 extends through the outer surface 32 and is closed by the inner surface 31. The surrounding wall 33 has two opposite through holes 331 that communicate with the receiving hole 34 and that are disposed at two opposite sides of the receiving hole 34. In this embodiment, the surrounding wall 33 has a circular outer surface, and the receiving hole 34 has a circular cross-section.

The locking mechanism 4 is disposed in proximity to the inner surface 31 and the surrounding wall 33. In this embodiment, the locking mechanism 4 includes a pair of movable levers 6, a drive unit 7 and a restoring unit 8. Each of the movable levers 6 has an engaging portion 61 that is movably inserted into the receiving hole 34 through a corresponding one of the through holes 331 of the surrounding wall 33, a pivot portion 63, an intermediate portion 62 that interconnects the engaging portion 61 and the pivot portion 63, and a driven portion 64 that extends from one side of the pivot portion 63 away from the intermediate portion 62. The movable levers 6 are connected pivotally to each other in a scissor fashion at the pivot portions 63 of the movable levers 6. The driven portion 64 of one of the movable levers 6 is opposite to and spaced-apart from the driven portion 64 of the other of the movable levers 6. Preferably, the intermediate portions 62 of the movable levers 6 are curved around the outer surface of the surrounding wall 33. Specifically, the pivot portion 63 of one of the movable levers 6 extends upwardly from the corresponding intermediate portion 62 in a ladderlike fashion and is stacked up on the pivot portion 63 of the other of the movable levers 6, such that the intermediate portions 62 and the engaging portions 61 of the movable levers 6 are substantially coplanar. Preferably, the pivot portions 63 of the movable levers 6 respectively have through holes 631 (only one can be seen) that are aligned with each other in a top-bottom direction. The base 3 has a positioning shaft 35 that extends through the through holes 631 of the movable levers 6. The driven portion 64 of each of the movable levers 6 has an inclined surface 643. The inclined surfaces 643 of the movable levers 6 face each other and are spaced apart from each other. Preferably, the driven portion 64 of each of the movable levers 6 further has an upright section 641 that transversely extends from the pivot portion 63 and a guiding projection 642 that outwardly projects from a distal end of the upright section 641. The guiding projection 642 has the inclined surface 643.

Figure 3:
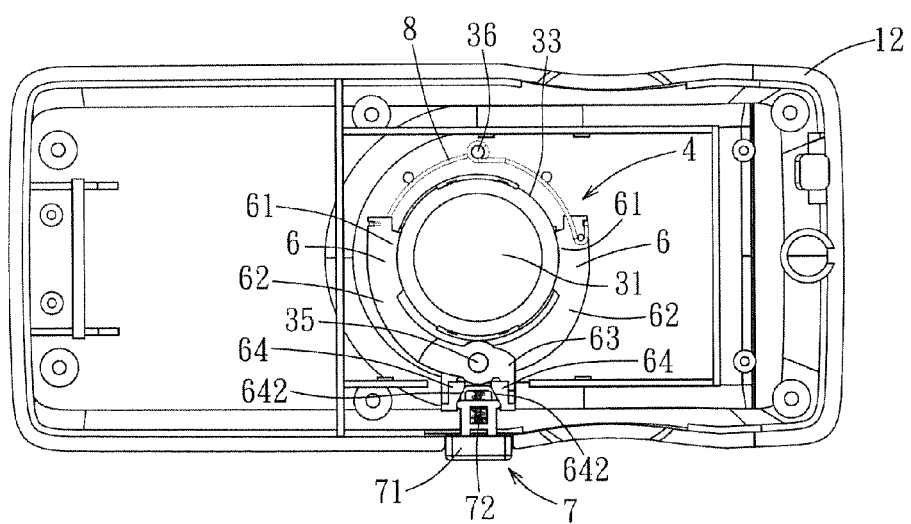
FIG. 3 is a bottom view illustrating the locking mechanism of the clip assembly of the preferred embodiment.
Figure 4:
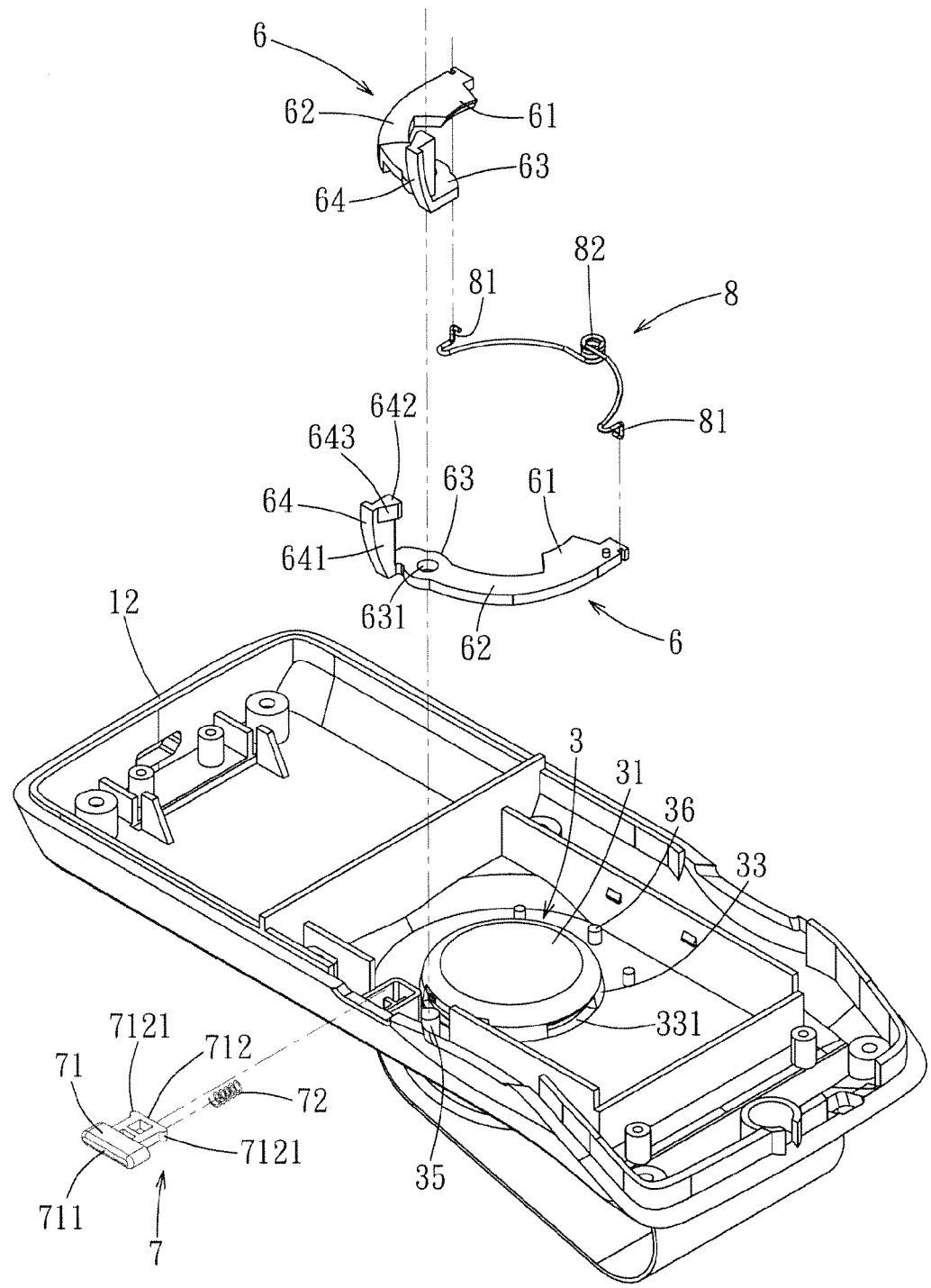
FIG. 4 is an exploded perspective view illustrating the locking mechanism of the clip assembly of the preferred embodiment.
Figure 5:
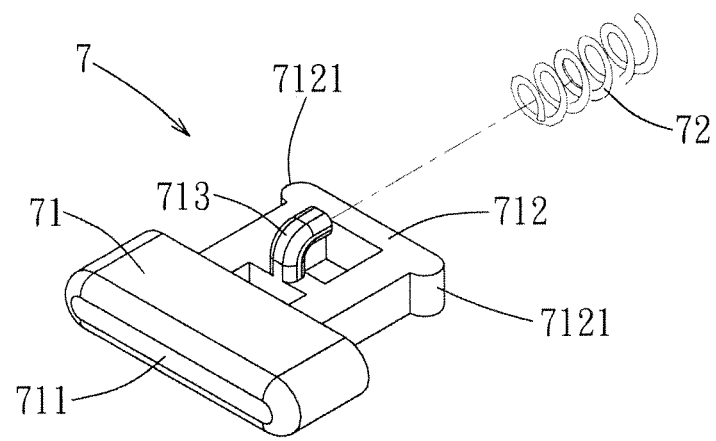
FIG. 5 is a an exploded perspective view illustrating a drive unit of the locking mechanism of the clip assembly of the preferred embodiment.
Figure 6:
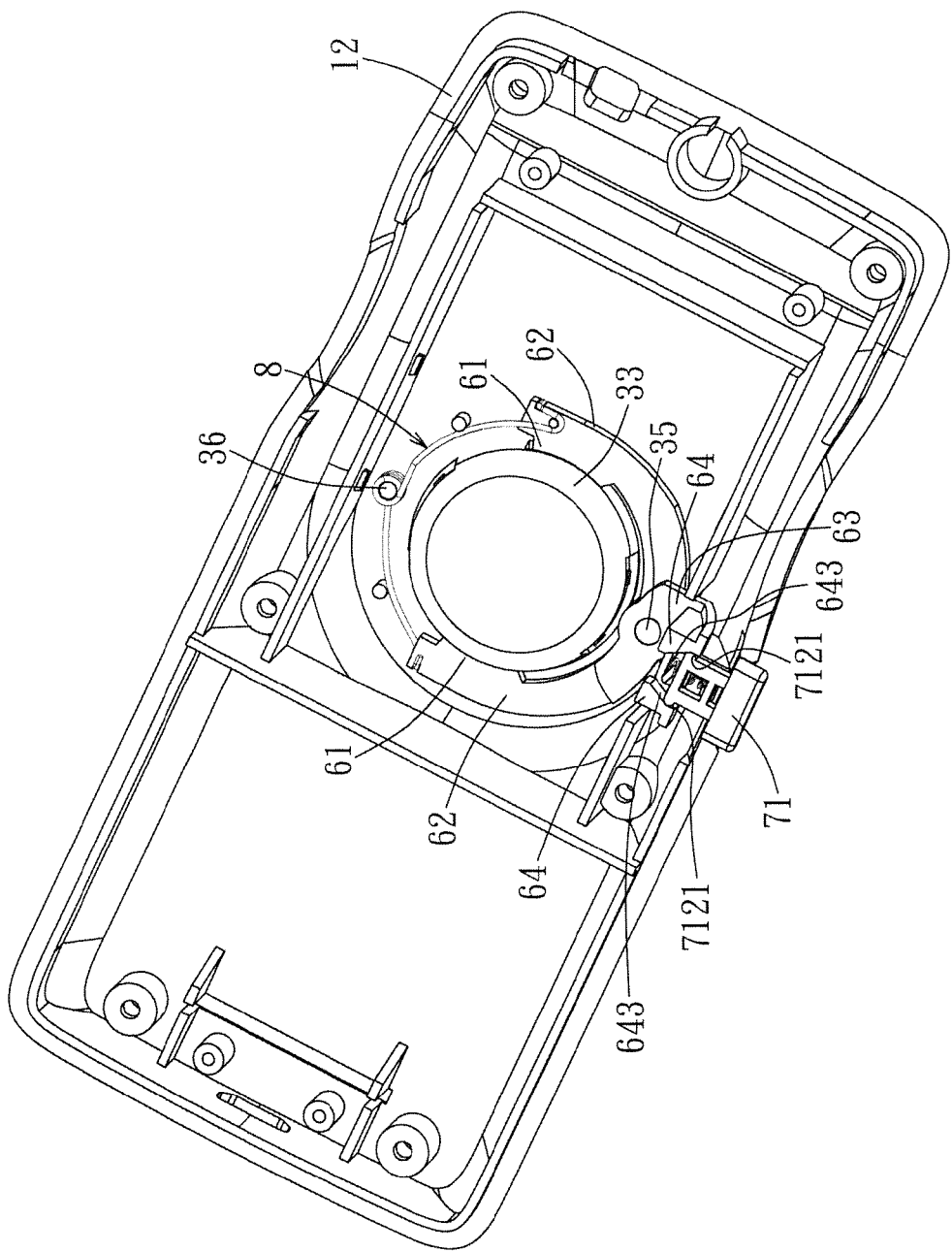
FIG. 6 is a perspective view illustrating a button of the drive unit at an un-pressed position.
Figure 7:
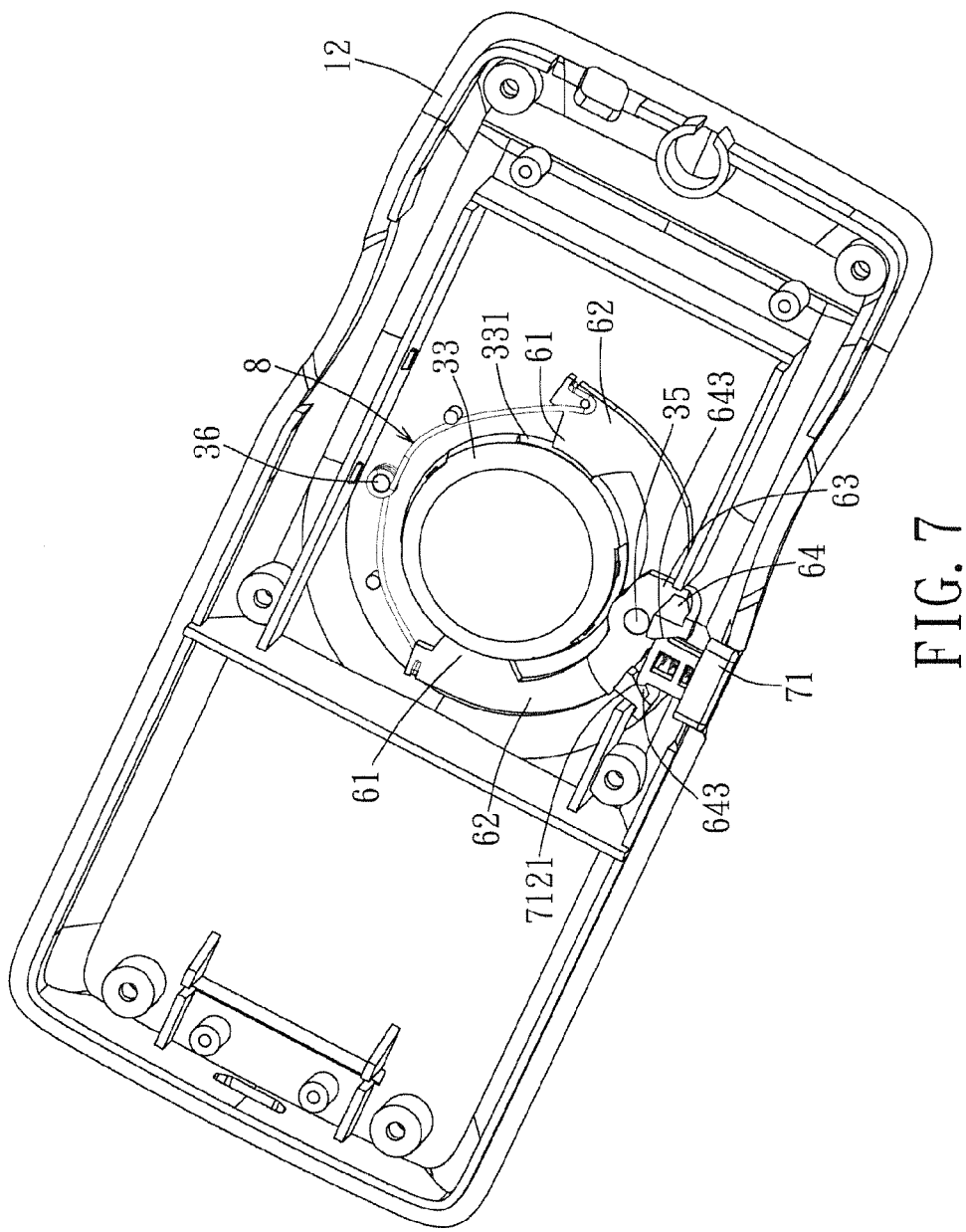
FIG. 7 is a perspective view illustrating the button of the drive unit at a pressed position.

The drive unit 7 has a button 71 that is disposed between the driven portions 64 of the movable levers 6. The button 71 is movable between an un-pressed position (as shown in FIGS. 3 and 6) and a pressed position (as shown in FIG. 7). The driven portions 64 are pushed to move the engaging portions 61 away from each other and out of the receiving hole 34 via the through holes 331 through a movement of the button 71 from the un-pressed position to the pressed position. In this embodiment, the button 71 has a press portion 711 and an abutment portion 712 distal from the press portion 711. The abutment portion 712 has two opposite abutting sides 7121 to respectively abut against the inclined surfaces 643 of the driven portions 64 of the movable levers 6. The abutting sides 7121 are disposed between the inclined surfaces 643 at a position where a distance between the inclined surfaces 643 is wide when the button 71 is in the un-pressed position. With further reference to FIGS. 6 and 7, the button 71 moves toward the surrounding wall 33 when moving from the un-pressed position to the pressed position. The driven portions 64 move away from each other when the abutting sides 7121 of the abutment portion 712 of the button 71 slide along and push the inclined surfaces 643 of the movable levers 6. Specifically, the inclined surfaces 643 of the movable levers 6 are converged toward each other in a direction from the button 71 to the surrounding wall 33, i.e., the inclined surfaces 643 cooperative define therebetween a distance that is gradually narrowed toward the surrounding wall 33. However, the abutting sides 7121 of the button 71 are spaced apart from each other at a fixed distance. During movement of the button 71 from the un-pressed position to the pressed position in a direction toward the surrounding wall 33, since the abutting sides 7121 are provided at the foremost end of the button 71, if the distance between the inclined surfaces 643 is smaller than the distance between the abutting sides 7121, the abutting sides 7121 push the inclined surfaces 643 to allow for further movement of the button 71 toward the surrounding wall 33. When the inclined surfaces 643 are pushed, the driven portions 64 move away from each other and are pivotally rotated relative to the fixed shaft 35. The intermediate portions 62 are driven to be rotated relative to the fixed shaft 35, such that ends of the intermediate portions 62 away from the pivot portions 63 move away from each other and from the surrounding wall 33. As a result, referring further to FIG. 9, the engaging portions 61 are ejected from the receiving hole 34 through the through holes 331. Preferably, the drive unit 7 further includes a resilient member 72 to force the button 71 to move from the pressed position to the un-pressed position. With further reference to FIGS. 3 and 5, the button 71 has a spring retaining portion 713. The press portion 711 is distal from the driven portions 61 of the movable levers 6, thereby being partly and outwardly protruded from the housing 1 for a user to press thereon. In this embodiment, the resilient member 72 is a compression spring. The resilient member 72 has one end fixed on the spring retaining portion 713 and the other end mounted on the seat 3. The resilient member 72 enables the button 71 to be restored from the pressed position to the un-pressed position. Specifically, when the button 71 is pressed by an external force to move from the un-pressed position (as shown in FIG. 6) to the pressed position (as shown in FIG. 7), the resilient member 72 is compressed to store a restoring force. When the external force is released, the restoring force of the resilient member 72 restores the button 71 from the pressed position to the un-pressed position until the next time the button 71 is pressed.

Referring to FIGS. 3, 4, 6, and 7, the restoring unit 8 is connected to the intermediate portions 62 of the movable levers 6 so that the movable levers 6 are restored to original positions thereof when the button 71 is un-pressed. In this embodiment, the restoring unit 8 is a torsion spring that cooperates with the movable levers 6 to surround the outer surface of the surrounding wall 33. Preferably, the restoring unit 8 has two ends 81, each of which is pivoted to the end of the intermediate portion 62 away from the pivot portion 63 of the corresponding movable lever 6, and a positioning hole 82 that is disposed at a central point of the restoring unit 8 and that receives and positions a positioning protrusion 36 of the seat 3. In this embodiment, the positioning hole 82 and the pivot portions 63 of the movable levers 6 are disposed at two opposite sides of the surrounding wall 33. When the button 71 is pressed by the external force to move from the un-pressed position (as shown in FIG. 6) to the pressed position (as shown in FIG. 7), the ends of the intermediate portions 62 away from the pivot portions 63 rotate about the fixed shaft 35 and move away from each other, such that the two ends 81 of the restoring unit 8 move away from each other and the restoring unit 8 restores an elastically restorable force. When the button 71 is released from pressing, by virtue of the elastically restorable force of the restoring unit 8, the intermediate portions 62 are restored to original positions, and thus, the driven portions 64 are restored to original positions, i.e., the movable levers 6 are restored to original positions thereof.

Figure 8:
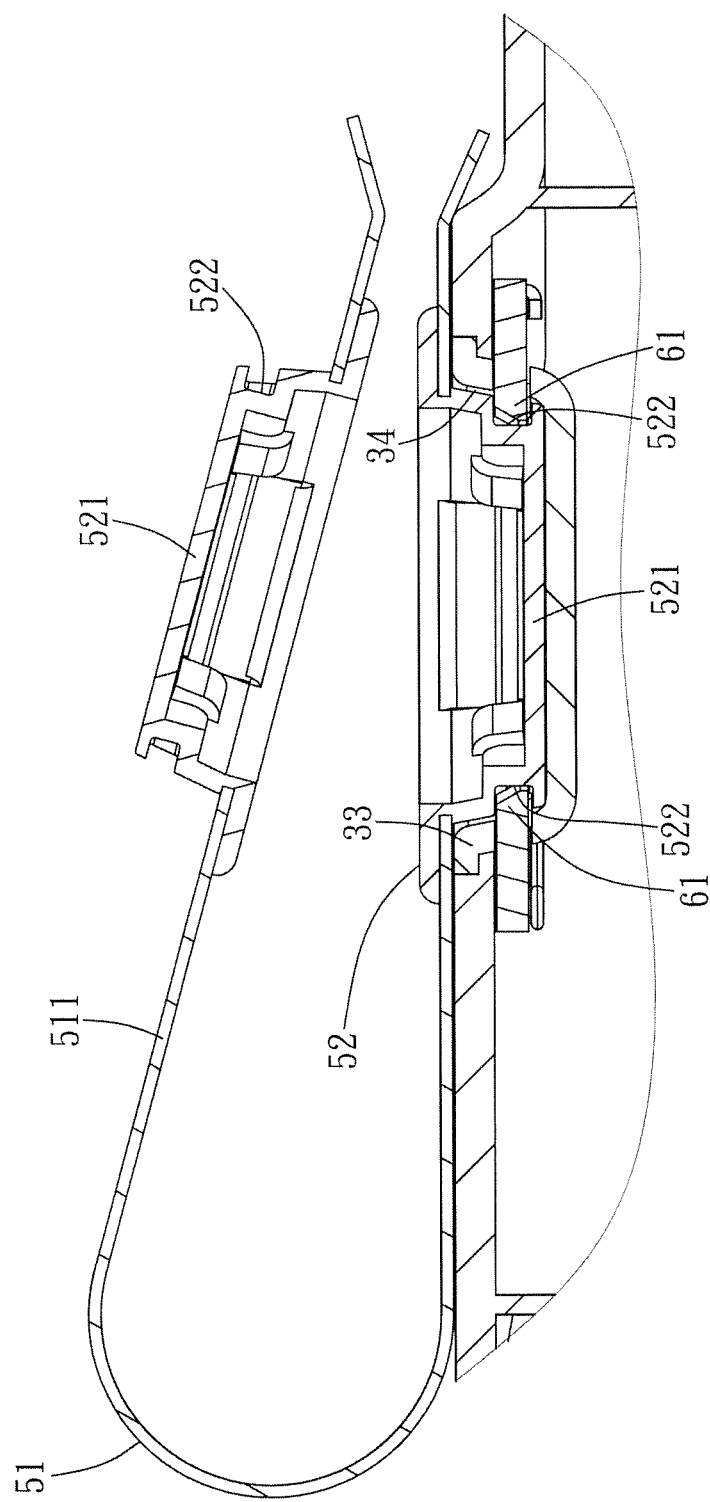
FIG. 8 is a fragmentary sectional view of the clip assembly of the preferred embodiment, illustrating an engaged relationship between the locking mechanism and the clip mechanism when the button is at the un-pressed position.
Figure 9:
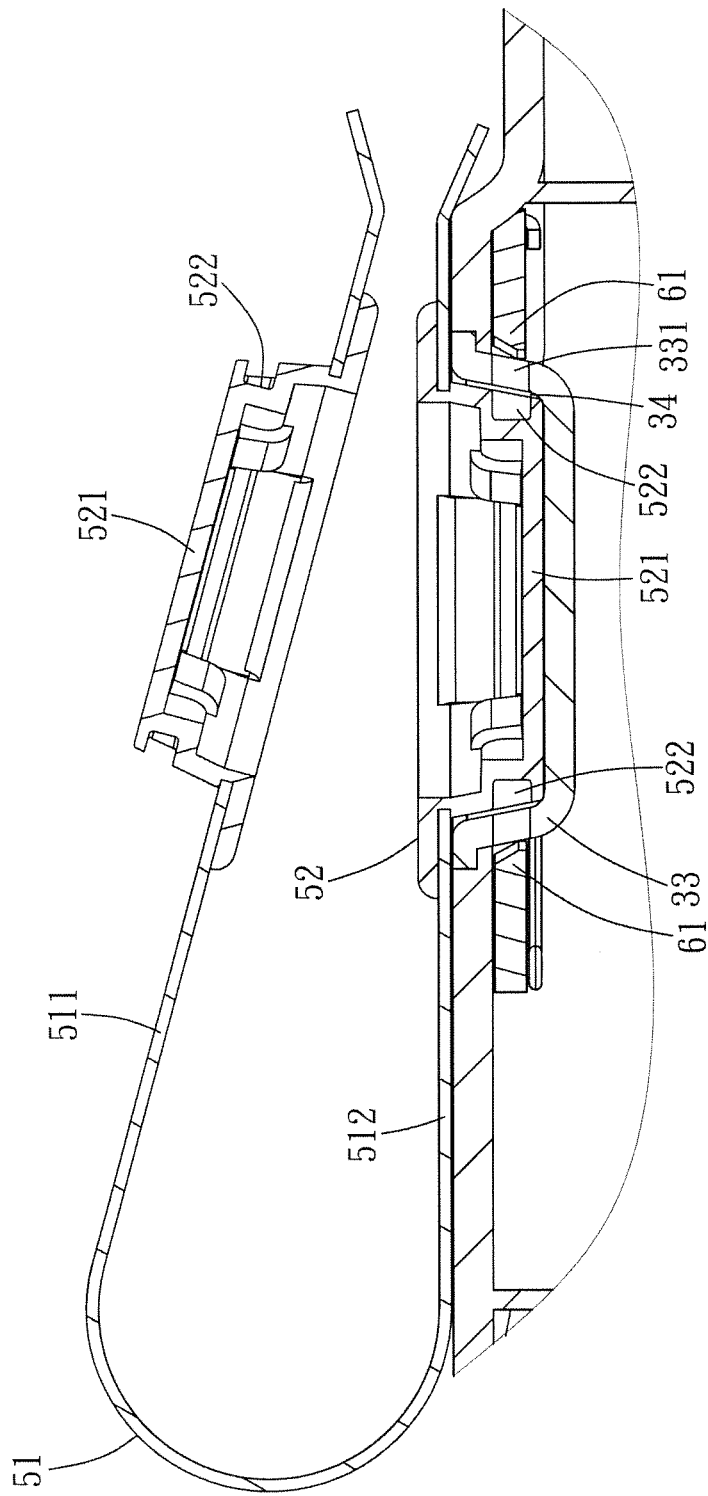
FIG. 9 is a fragmentary sectional view of the clip assembly of the preferred embodiment, illustrating a disengaged relationship between the locking mechanism and the clip mechanism when the button is at the pressed position.

Referring to the FIGS. 1, 2, 8 and 9, the clip mechanism 5 includes an elastic clip 51 and a connection member 52. The elastic clip 51 has first and second arms 511, 512 that are movable toward or away from each other. The connection member 52 is disposed on the first arm 511 and has a connection body 521 that extends outwardly from the first arm 511 in a direction away from the second arm 512. The connection body 521 is received in the receiving hole 34 and has two connecting holes 522 respectively engageable with the engaging portions 61. In addition, the base 3 further has a plurality of spaced-apart limiting protrusions 37. Each of the limiting protrusions 37 extends inwardly from the surrounding wall 33 into the receiving hole 34. The connection body 521 of the connection member 52 further has a plurality of positioning grooves 523 that receive respectively the limiting protrusions 37. Preferably, as shown in FIGS. 8 and 9, the clip mechanism 5 further includes another connection member 52 that is disposed on the second arm 512 in symmetry with the connection member 52 disposed on the first arm 511 and that extends outwardly from the second arm 512 in a direction away from the first arm 511. A user may choose the connection member 52 on one of the first and second arms 511, 512 to be assembled with the receiving hole 34. During assembly, by virtue of the engagement among the positioning grooves 523 and the limiting protrusions 37, the connection body 521 of the connection member 52 is pressed toward the receiving hole 34. When the connection body 521 moves in the receiving hole 34, the engaging portions 61 are pushed out from the receiving hole 34. When the connection body 521 is completely received in the receiving hole 34, the connecting holes 522 correspond in position to the through holes 331 such that the engaging portions 61 are capable of reentering in the receiving hole 34 therethrough. The restoring unit 8 acts to restore the engaging portions 61 to the original positions thereof, such that the engaging portions 61 are respectively engaged to the connecting holes 522. Accordingly, the clip mechanism 5 and the housing 1 are securely assembled with each other. When it is required to disengage the clip mechanism 5 and the housing 1 from each other, as mentioned above, pressing the button 71 enables the engaging portions 61 to move out of the receiving hole 34 via the connecting holes 522 and the through holes 331. As a result, the connection member 52 is capable of being removed from the receiving hole 34, such that the elastic clip 51 is disengaged from the housing 1. Hence, pressing the button 71 readily enables the elastic clip 51 to be disengaged from the housing 1.

In practical use, the elastic clip 51 is capable of being clipped to a sun visor of a vehicle (not shown), which is foldable to abut against a roof of the vehicle for storage or to be away from the roof for shading from the sun. With the first and second arms 511, 512 of the elastic clip 51 being respectively disposed on two sides of the sun visor, (for example, when the sun visor is in the storage position, the first arm 511 may be proximate to the roof and the second arm 512 may be oriented to face a car seat), since two connection members 52 are provided respectively and symmetrically on the first and second arms 511, 512, when the sun visor is in the storage position, the user may use the connecting member 52 disposed on the second arm 512 for coupling the housing 1 of the electronic device 100, and when the sun visor is in use, the user may use the connecting member 52 disposed on the first arm 511 for coupling the housing 1 of the electronic device 100. Therefore, regardless of the position of the sun visor, the user is able to attach the electronic device 100 to the sun visor with convenience. In some embodiments, the clip mechanism 5 may include only one connecting member 52 that is disposed on either the first or second arms 511, 512.

To sum up, for the clip assembly 2 of the present invention, pressing the button 71 permits disengagement of the clip mechanism 5, such that the housing 1 of the electronic device 100 may be disassembled from the elastic clip 51. Moreover, when the connecting member 52 of the clip mechanism 5 is pressed into the receiving hole 34, the elastic clip 51 and the housing 1 are readily assembled together. Therefore, the clip assembly 2 of the present invention is not only simple to use, but can also be quickly assembled with or disassembled from the housing 1, thereby saving time and effort.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A clip assembly comprising:
    a base having an inner surface, an outer surface, and a surrounding wall that extends from said outer surface to said inner surface and that defines a receiving hole, said receiving hole extending through said outer surface and being closed by said inner surface, said surrounding wall having two opposite through holes that communicate with said receiving hole and that are respectively disposed at two opposite sides of said receiving hole;
    a locking mechanism disposed in proximity to said inner surface and said surrounding wall, said locking mechanism including a pair of movable levers, a drive unit and a restoring unit, each of said movable levers having an engaging portion that is movably inserted into said receiving hole through a corresponding one of said through holes of said surrounding wall, a pivot portion, an intermediate portion that interconnects said engaging portion and said pivot portion, and a driven portion that extends from one side of said pivot portion away from said intermediate portion, said movable levers being connected pivotally to each other in a scissor fashion at said pivot portions of said movable levers, said driven portion of one of said movable levers being opposite to and spaced-apart from said driven portion of the other of said movable levers, said drive unit having a button that is disposed between said driven portions of said movable levers, said button being movable between an un-pressed position and a pressed position, said driven portions being pushed to move said engaging portions away from each other and out of said receiving hole via said through holes through a movement of said button from said un-pressed position to said pressed position, said restoring unit being connected to said intermediate portions of said movable levers so that said movable levers are restored to original positions thereof when said button is un-pressed; and
    a clip mechanism including an elastic clip and a connection member, said elastic clip having first and second arms that are movable toward or away from each other, said connection member being disposed on said first arm and having a connection body that extends outwardly from said first arm in a direction away from said second arm, said connection body being receivable in said receiving hole and having two connecting holes that respectively engage said engaging portions when said connection body is received in said receiving hole, said engaging portions being disengageable from said connecting holes by pressing said button.

2. The clip assembly as claimed in claim 1, wherein said drive unit further includes a resilient member to force said button to move from said pressed position to said un-pressed position.

3. The clip assembly as claimed in claim 2, wherein said resilient member is a compression spring, said button having a press portion, an abutment portion and a spring retaining portion, said press portion being distal from said driven portions of said movable levers, said abutment portion having two opposite abutting sides that respectively abut against said driven portions of said movable levers, said resilient member having one end that is fixed on said spring retaining portion and the other end that is mounted on said base.

4. The clip assembly as claimed in claim 1, wherein said surrounding wall has a circular outer surface, said intermediate portions of said movable levers being curved around said outer surface of said surrounding wall.

5. The clip assembly as claimed in claim 1, wherein said driven portion of each of said movable levers has an inclined surface, said inclined surfaces of said movable levers being spaced apart from each other, said inclined surfaces of said movable levers being converged toward each other in a direction from said button to said surrounding wall, said button having a press portion and an abutment portion that is distal from said press portion, said abutment portion having two opposite abutting sides to respectively abut against said inclined surfaces of said driven portions of said movable levers, said abutting sides being disposed between said inclined surfaces at a position where a distance between said inclined surfaces is wide when said button is in said un-pressed position, said button moving toward said surrounding wall when moving from said un-pressed position to said pressed position, said driven portions moving away from each other when said abutting sides of said abutment portion of said button slide along and push said inclined surfaces of said movable levers.

6. The clip assembly as claimed in claim 5, wherein said driven portion of each of said movable levers further has an upright section that transversely extends from said pivot portion and a guiding projection that outwardly projects from an end of said upright section, said guiding projection having said inclined surface.

7. The clip assembly as claimed in claim 1, wherein said restoring unit is a torsion spring that cooperates with said movable levers to surround an outer surface of said surrounding wall.

8. The clip assembly as claimed in claim 1, wherein said clip mechanism further includes another connection member that is disposed on said second arm in symmetry with said connection member disposed on said first arm.

9. The clip assembly as claimed in claim 1, wherein said base further has a plurality of spaced-apart limiting protrusions, each of said limiting protrusions extending inwardly from said surrounding wall into said receiving hole, said connection body of said connection member further having a plurality of positioning grooves that receive respectively said limiting protrusions.

10. An electronic device comprising:
    a housing;
    a circuit module disposed in said housing; and
    a clip assembly including:
        a base formed integrally with said housing and having an inner surface, an outer surface, and a surrounding wall that extends from said outer surface to said inner surface and that defines a receiving hole, said receiving hole extending through said outer surface and being closed by said inner surface, said surrounding wall having two opposite through holes that communicate with said receiving hole and that are respectively disposed at two opposite sides of said receiving hole,
        a locking mechanism disposed in proximity to said inner surface and said surrounding wall, said locking mechanism including a pair of movable levers, a drive unit and a restoring unit, each of said movable levers having an engaging portion that is movably inserted into said receiving hole through a corresponding one of said through holes of said surrounding wall, a pivot portion, an intermediate portion that interconnects said engaging portion and said pivot portion, and a driven portion that extends from one side of said pivot portion away from said intermediate portion, said movable levers being connected pivotally to each other in a scissor fashion at said pivot portions of said movable levers, said driven portion of one of said movable levers being opposite to and spaced-apart from said driven portion of another one of said movable levers, said drive unit having a button that is disposed between said driven portions of said movable levers, said button being movable between an un-pressed position and a pressed position, said driven portions being pushed to move said engaging portions away from each other and out of said receiving hole via said through holes through a movement of said button from said un-pressed position to said pressed position, said restoring unit being connected to said intermediate portions of said movable levers so that said movable levers are restored to original positions thereof when said button is un-pressed, and a clip mechanism including an elastic clip and a connection member, said elastic clip having first and second arms that are movable toward or away from each other, said connection member disposed on said first arm and having a connection body that extends outwardly from said first arm in a direction away from said second arm, said connection body being receivable in said receiving hole and having two connecting holes that respectively engage said engaging portions when said connection body is received in said receiving hole, said engaging portions being disengageable from said connecting holes by pressing said button.

11. The electronic device as claimed in claim 10, wherein said drive unit further includes a resilient member to force said button to move from said pressed position to said un-pressed position.

12. The electronic device as claimed in claim 11, wherein said resilient member is a compression spring, said button having a press portion, an abutment portion, and a spring retaining portion, said press portion being distal from said driven portions of said movable levers, said abutment portion having two opposite abutting sides that respectively abut against said driven portions of said movable levers, said resilient member having one end that is fixed on said spring retaining portion and the other end that is mounted on said base.

13. The electronic device as claimed in claim 10, wherein said surrounding wall has a circular outer surface, said intermediate portions of said movable levers being curved around said outer surface of said surrounding wall.

14. The electronic device as claimed in claim 10, wherein said driven portion of each of said movable levers has an inclined surface, said inclined surfaces of said movable levers being spaced apart from each other, said inclined surfaces of said movable levers being converged toward each other in a direction from said button to said surrounding wall, said button having a press portion and an abutment portion that is distal from said press portion, said abutment portion having two opposite abutting sides to respectively abut against said inclined surfaces of said driven portions of said movable levers, said abutting sides being disposed between said inclined surfaces at a position where a distance between said inclined surfaces is wide when said button is in said un-pressed position, said button moving toward said surrounding wall when moving from said un-pressed position to said pressed position, said driven portions moving away from each other when said abutting sides of said abutment portion of said button slide along and push said inclined surfaces of said movable levers.

15. The electronic device as claimed in claim 14, wherein said driven portion of each of said movable levers further has an upright section that transversely extends from said pivot portion and a guiding projection that outwardly projects from an end of said upright section, said guiding projection having said inclined surface.

16. The electronic device as claimed in claim 10, wherein said restoring unit is a torsion spring that cooperates with said movable levers to surround an outer surface of said surrounding wall.

17. The electronic device as claimed in claim 10, wherein said clip mechanism further includes another connection member that is disposed on said second arm in symmetry with said connection member disposed on said first arm.

18. The electronic device as claimed in claim 10, wherein said seat further has a plurality of spaced-apart limiting protrusions, each of said limiting protrusions extending inwardly from said surrounding wall into said receiving hole, said connection body of said connection member further having a plurality of positioning grooves that receive respectively said limiting protrusions.

* * * * *